United States Patent
Conroy

(10) Patent No.: US 6,292,125 B1
(45) Date of Patent: Sep. 18, 2001

(54) DIGITAL-TO-ANALOG CONVERTER USING WEIGHTS STORED IN A WEIGHT TABLE

(75) Inventor: Cormac S. Conroy, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/408,016

(22) Filed: Sep. 29, 1999

(51) Int. Cl.[7] .................................................. H03M 1/80
(52) U.S. Cl. .............................................. 341/153; 341/163
(58) Field of Search ................................. 341/144, 153, 341/155, 166, 163

(56) References Cited

U.S. PATENT DOCUMENTS

| | | | |
|---|---|---|---|
| 4,212,074 | * 7/1980 | Kuno et al. | 364/567 |
| 4,336,526 | * 6/1982 | Weir | 340/347 AD |
| 4,451,821 | * 5/1984 | Domogalla | 340/347 D |
| 4,852,130 | * 7/1989 | Draxelmayr | 377/81 |
| 4,970,514 | 11/1990 | Draxelmayr | 341/120 |
| 5,107,377 | * 4/1992 | Ballard | 360/40 |

* cited by examiner

*Primary Examiner*—Peguy JeanPierre

(57) ABSTRACT

A digital-to-analog converter ("DAC") and method for digital-to-analog conversion is disclosed. The DAC generally comprises a plurality of analog weights, a weight table adapted to store digital sizes of the plurality of analog weights, and a converter for searching for selected weights from the plurality of analog weights using the digital sizes stored in the weight table and for mapping a binary input to the selected analog weights. The digital sizes of all except for at least two of the analog weights are successively approximated using the assigned sizes of at least two of the analog weights. The method for digital-to-analog conversion, comprising receiving the binary input, searching for selected weights from analog weights using a weight table storing digital sizes of the analog weights, mapping the binary input to the selected weights, and outputting a sum of the selected analog weights.

31 Claims, 6 Drawing Sheets

| Nominal Sizes of Weights | Weight Table (Calibrated) | |
|---|---|---|
| 125405 | 125412 | (t) |
| 65718 | 65720 | (s) |
| 34791 | 34794 | (r) |
| 18250 | 18252 | (q) |
| 9609 | 9608 | (p) |
| 5093 | 5095 | (o) |
| 2924 | 2922 | (n) |
| 1482 | 1487 | (m) |
| 727 | 728 | (l) |
| 370 | 367 | (k) |
| 341 | 343 | (j) |
| 180 | 180 | (i) |
| 96 | 95 | (h) |
| 52 | 50 | (g) |
| 26 | 26 | (f) |
| 13 | 14 | (e) |
| 8 | 8 | (d) |
| 4 | 4 | (c) |
| 2 | 2 | (b) |
| 1 | 1 | (a) |

FIG. 7

DIGITAL-TO-ANALOG CONVERTER USING WEIGHTS STORED IN A WEIGHT TABLE

BACKGROUND OF THE INVENTION

1. Field of the Invention

The present invention generally relates to digital-to-analog converters (DACs). More specifically, a DAC using weights stored in a look up table is disclosed.

2. Description of Related Art

In a DAC, a binary input is converted to an analog voltage or current output that is proportional to the value of the binary input. For an n-bit binary input, the converter output is one of $2^n$ possible analog outputs. For a DAC having voltage output, the voltages representing the possible outputs may be obtained with a network of capacitors, resistors, or current sources and current switches connected to the binary input.

Digital-to-analog conversion can be achieved using a number of different methods. One example is a ladder network using a network of resistors. A ladder network typically receives binary input voltages, each input voltage being 0 V or $V_{reference}$, and provides an analog output voltage proportional to the value of the binary input. For example, a ladder network may have four stages for accepting four input voltages, representing four bits of digital data or sixteen possible input values, and an output voltage at one of sixteen possible output levels proportional to the value of the digital data input. Providing more stages in a ladder network allows more bits of binary input and requires greater voltage resolution. In general, the voltage resolution of a ladder network with n ladder stages is $V_{reference}/2^n$.

A DAC typically contains a set of weights generated by an analog circuit typically scaled in a binary fashion. The DAC receives a binary input which selects certain weights for the output. One problem associated with DACs is that the DAC presumes that the analog voltage or current circuit generates ideal output steps while the analog circuit generates non-ideal output steps. Thus, the DAC output voltage varies from the voltage selected by the binary input. The non-ideal characteristics of the output may be due to such factors as process variations and/or temperature.

What is needed is a DAC that eliminates the non-ideal characteristics of the output and/or compensates for irregularities in order to achieve a more accurate and more reliable digital-to-analog conversion. Ideally, the output of the DAC should be independent of variations in factors that are difficult to control such as the temperature and device characteristics that vary as a result of the manufacturing process. It is also desirable to provide a DAC that can be calibrated and recalibrated over time to take into account non-ideal characteristics of the output steps.

SUMMARY OF THE INVENTION

A system and method for digital-to-analog conversion is disclosed that provides an accurate and reliable digital-to-analog conversion. The DAC is calibrated initially to take into account non-ideal characteristics of the output so as to achieve accurate and reliable digital-to-analog conversion. The DAC can be recalibrated from time to time to take into account drifts in the characteristics of the output. The design of the DAC is such that variances in the manufacturing process for the converter and other factors do not degrade accuracy or reliability. It should be appreciated that the present invention can be implemented in numerous ways, including as a process, an apparatus, a system, a device, a method, or a computer readable medium such as a computer readable storage medium or a computer network wherein program instructions are sent over optical or electronic communication lines. Several inventive embodiments of the present invention are described below.

The DAC generally comprises a plurality of analog weights, a weight table adapted to store digital sizes of the plurality of analog weights, and a converter for searching for selected weights from the plurality of analog weights using the digital sizes stored in the weight table and for mapping a binary input to the selected analog weights. The digital sizes of all except for at least two of the analog weights are successively approximated using the assigned sizes of at least two of the analog weights.

The method for digital-to-analog conversion comprises receiving the binary input, searching for selected weights from analog weights using a weight table storing digital sizes of the analog weights, mapping the binary input to the selected weights, and outputting a sum of the selected analog weights.

In another embodiment, the method comprises successively comparing the digital signal to weights stored in an order according to size of each weight in a weight table, each comparing being between the digital signal and one of the weights, starting with a highest analog weight. The method further includes selecting the weight being compared that is no greater than the digital signal, subtracting the selected weight from the digital signal to generate a digital signal difference, repeating successively comparing, selecting, and subtracting with the digital signal difference instead of the digital signal and with the analog weights not previously compared until after the lowest analog weight is compared, and setting the analog signal as a sum of the selected weights.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 7 shows an example of a weight table with twenty weights and the corresponding nominal weights.

DESCRIPTION OF SPECIFIC EMBODIMENTS

A DAC is disclosed. The following description is presented to enable one of ordinary skill in the art to make and to use the invention and is provided in the context of a patent application and its requirements. Various modifications to the preferred embodiments will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
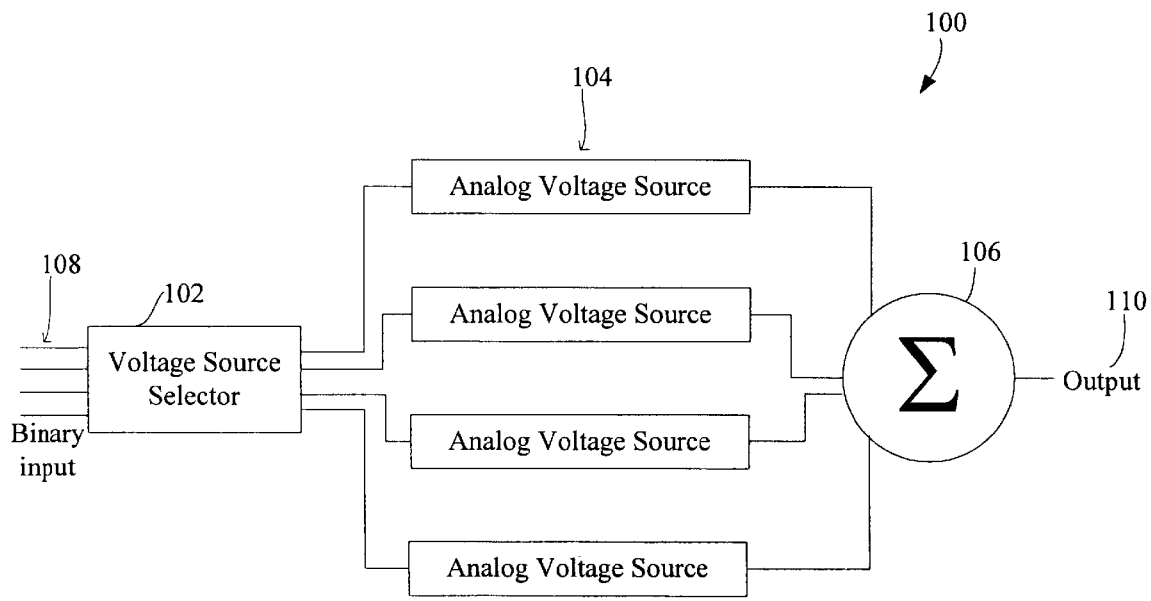
FIG. 1 is a simplified schematic of a DAC.

FIG. 1 is a simplified schematic of a DAC 100. The DAC 100 generally comprises a voltage source selector 102, a plurality of analog voltage sources or analog weights 104, and an adder 106. The voltage source selector 102 includes a plurality of input nodes for receiving bits of a binary input or digital signal 108 and an output node for outputting an analog voltage output 110. The voltage source selector 102 selects zero or more of the analog voltage sources 104 to be enabled and outputs voltage source selection signals to the selected analog voltage sources 104. The selected analog voltage sources 104 are enabled and the adder 106 sums the enabled analog voltage sources 106. The adder 106 outputs the sum as the analog voltage output 110.

Although the embodiments are described in terms of analog voltage sources 104 and the voltage source selector 102, it is to be understood that the DAC 100 can also be implemented using current sources or charge sources, i.e., voltages stored on a network of switched capacitors, rather than analog voltage sources or analog weights 104 and a current or charge source selector rather than the voltage source selector 102.

Figure 2:
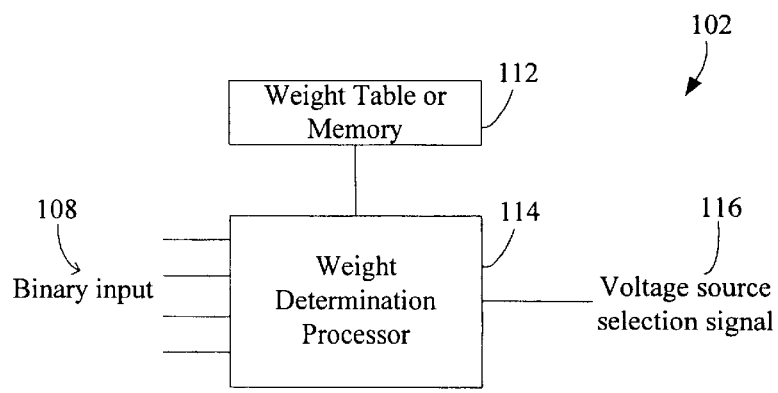
FIG. 2 is a schematic of a voltage source selector of the DAC of FIG. 1.

FIG. 2 is a schematic of a voltage source selector 102 of the DAC 100 of FIG. 1. The voltage source selector 102 generally comprises a weight memory table 112 and a weight determination processor 114. Prior to initialization, the weights 104 are assigned nominal values that correspond to target voltages for the weights. The weights are arranged in an order according to size, for example, from smallest to largest or from largest to smallest. At least two weights and preferably four or more weights having the smallest sizes have predetermined or assigned sizes stored in the weight table 112. The accuracy of the assigned sizes of those weights generally are not critical because they are typically the smallest weights. The weight determination processor 114 determines the actual sizes of the remainder of the weights by successive approximation and stores the sizes in the weight table 112.

The determination processor 114 also receives binary input 108 and uses the sizes stored in the weight memory 112 to determine voltage source selection signals 116. The voltage source selection signals 116 selectively enable the weights or analog voltage sources 104.

Figure 3:
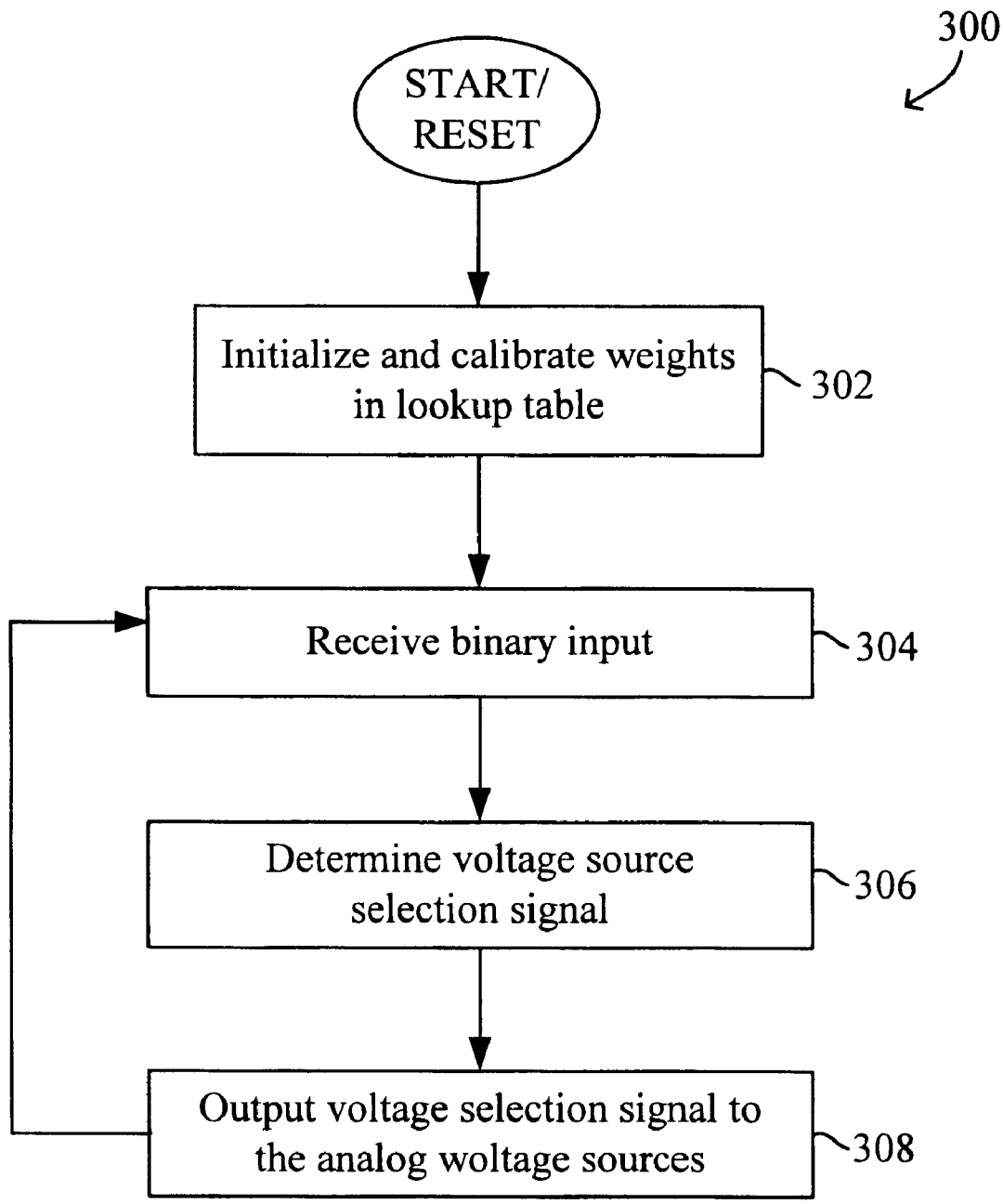
FIG. 3 is a flow chart illustrating a digital-to-analog conversion process implemented on the DAC of FIG. 1.

FIG. 3 is a flow chart illustrating a weight determination process 300 implemented in the weight selection processor 114 of the DAC 100. The weight determination process 300 begins with an initialize and calibrate step 302 to determine the actual or digital sizes of the weights of the analog voltage sources 104 and to store the determined digital sizes in the weight table. The weight determination process 300 then receives binary input in step 304 and determines the voltage source selection signal from the binary input using the digital sizes of the weights in the weight table in step 306. The voltage source selection signal is a binary word representing the specific analog voltage, current, or charge sources to be activated for the analog output. In particular, using the voltage source selection signal, the weight determination process 300 outputs the voltage source selection signal to the analog voltage sources in step 308. The weight determination process 300 then returns to the receiving binary input step 304.

Figure 4:
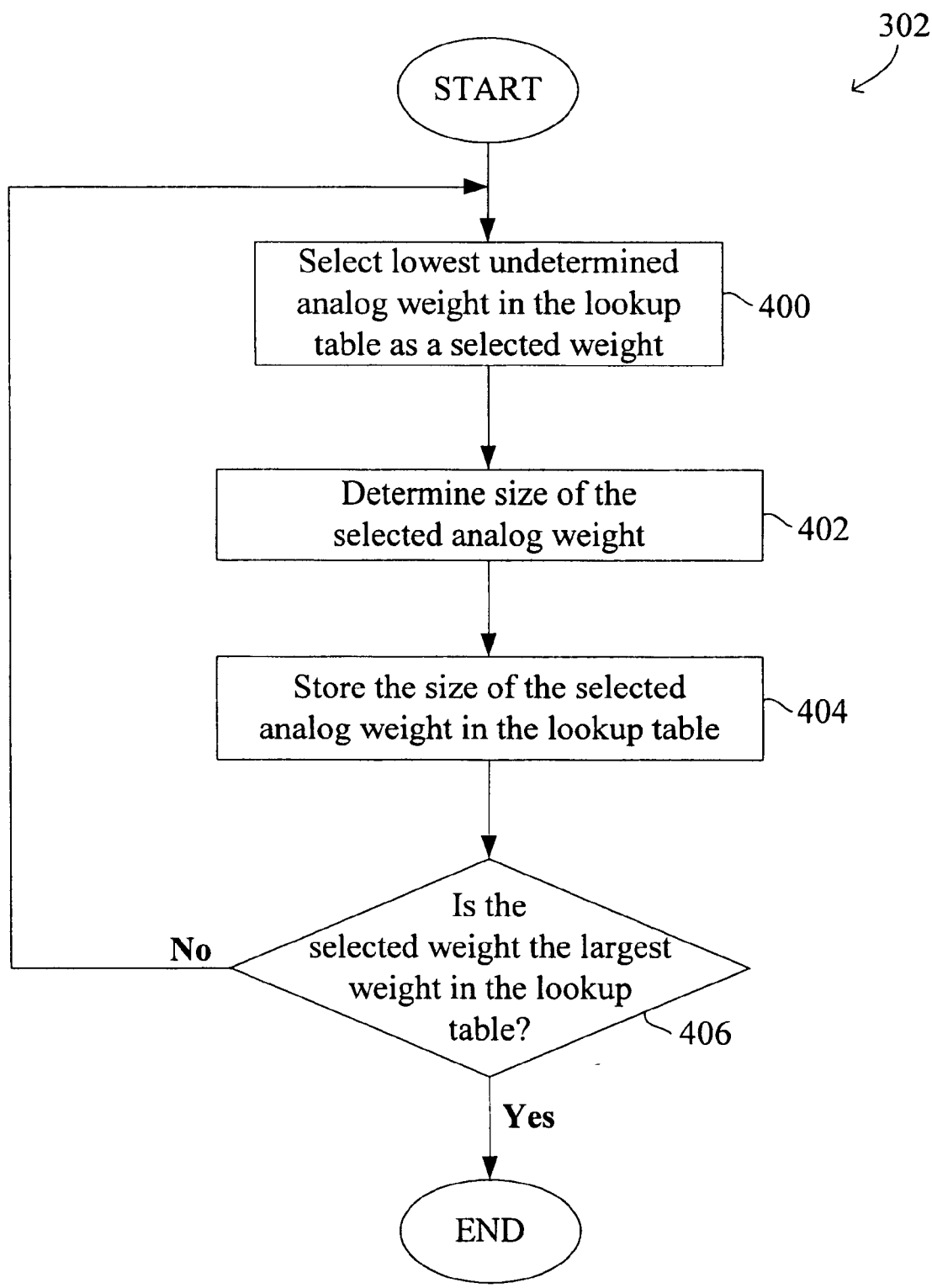
FIG. 4 is a flow chart illustrating an initialize and calibrate step of the digital-to-analog conversion process of FIG. 3.

FIG. 4 is a flow chart illustrating the initialize and calibrate step 302 of the weight determination process 300.

The initialize and calibrate step 302 begins by selecting the lowest undetermined weight of the analog weights as a selected weight in step 400 and determines the digital size of the selected analog weight in step 402, and stores the digital size of the selected analog weight in the weight memory or table in step 404. The initialize and calibrate step 302 then determines whether the selected analog weight is the largest weight in step 406 as the largest weight is the last weight determined by the initialize and calibrate step 302. If the selected analog weight is not the largest weight, the initialize and calibrate step 302 continues from the select step 400 until the selected analog weight is the largest weight. The determination of the size of the selected analog weight in step 402 is described in more detail with reference to FIG. 5.

Preferably, the above-described initialization and calibration step 302 is performed numerous times, for example, 1000 to 4000 times. An average of the results is then stored in the weight table as the calibrated sizes of the analog weights. The averaging of the results from several initialization and calibration steps tends to eliminate or reduce the undesired effect of noise and/or other undesirable factors on the calibration results.

Figure 5:
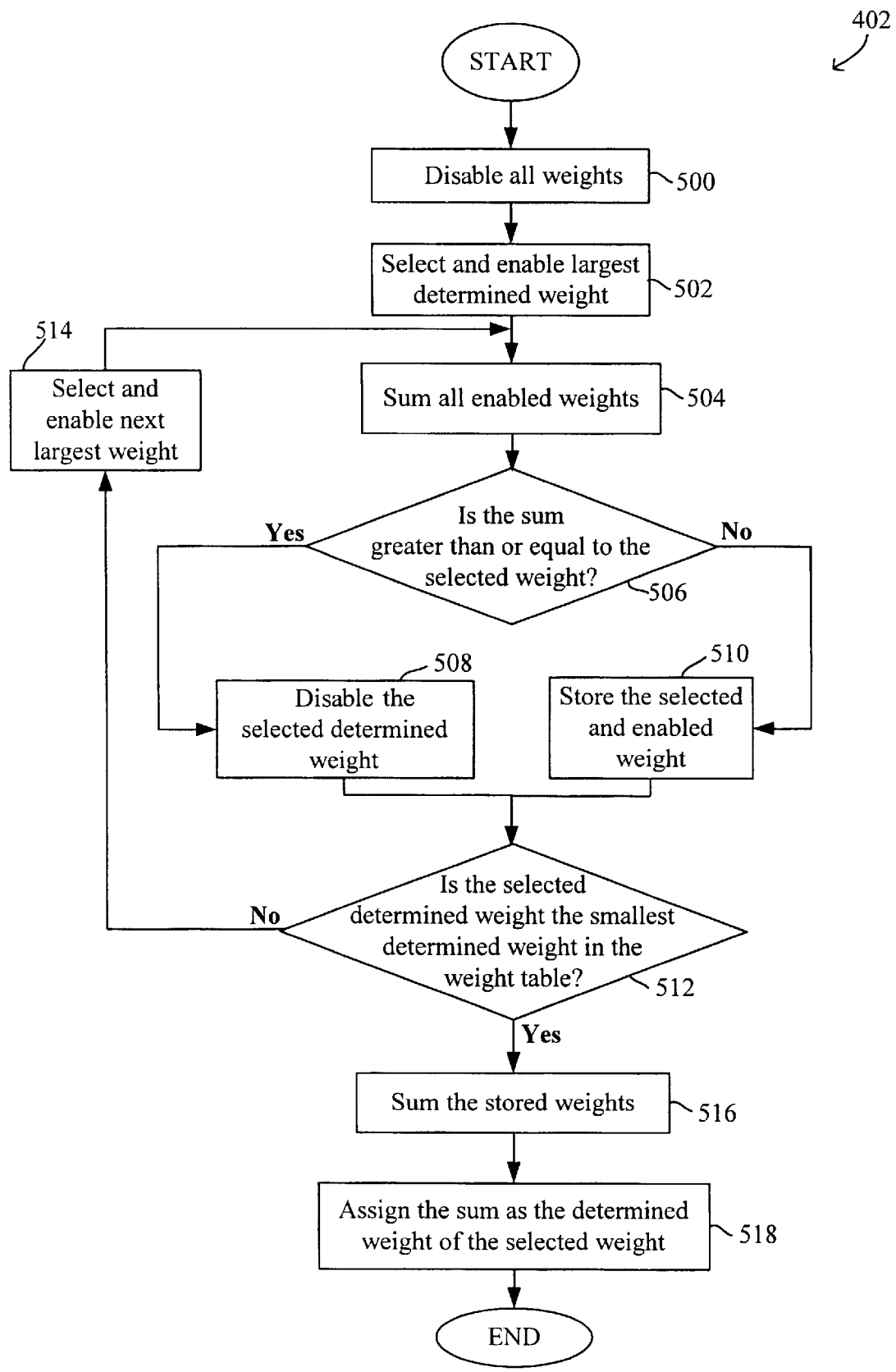
FIG. 5 is a flow chart illustrating determining weights in a weight table of the initialize and calibrate step of FIG. 4.

FIG. 5 is a flow chart illustrating the step 402 of determining the digital size of the analog weight selected in step 400. For each selected analog weight, the determination step 402 disenables all analog weights in step 500 and then selects and enables the largest weight having determined size in step 502. The determination step 402 then determines the sum of all enabled weight(s) in step 504 and compares the sum to the undetermined weight selected in step 400 with an analog comparator, i.e., an analog comparison. If the sum is greater than the selected undetermined analog weight, the selected determined weight is disenabled in step 508. If the sum is not greater than the selected undetermined weight, the selected and enabled determined weight is stored in step 510. In either case, the determination step 402 then determines whether the selected determined weight is the smallest weight in the weight table in step 512.

If the selected determined weight is not the smallest weight in the weight table as determined in step 512, the determination step 402 then selects and enables the next largest weight in step 514 and continues from the summing step 504 until the selected determined weight is the smallest weight in the weight table. The determination step 402 then sums the stored weights in step 516. Optionally, the determination step 402 then assigns the sum as the digital weight or size of the selected analog weight in step 518. The initialization and calibration step 302 then returns to step 404 to store the digital sum as the digital determined weight or size of the selected analog weight in the weight table as described above.

Rather than performing the above-described step 402 of determining the size of the analog weight, the initialization and calibration of weights step 302 may be achieved by using an accurate analog-to-digital converter to individually measure sizes of the weights and stored the measured digital sizes in the weight table.

Figure 6:
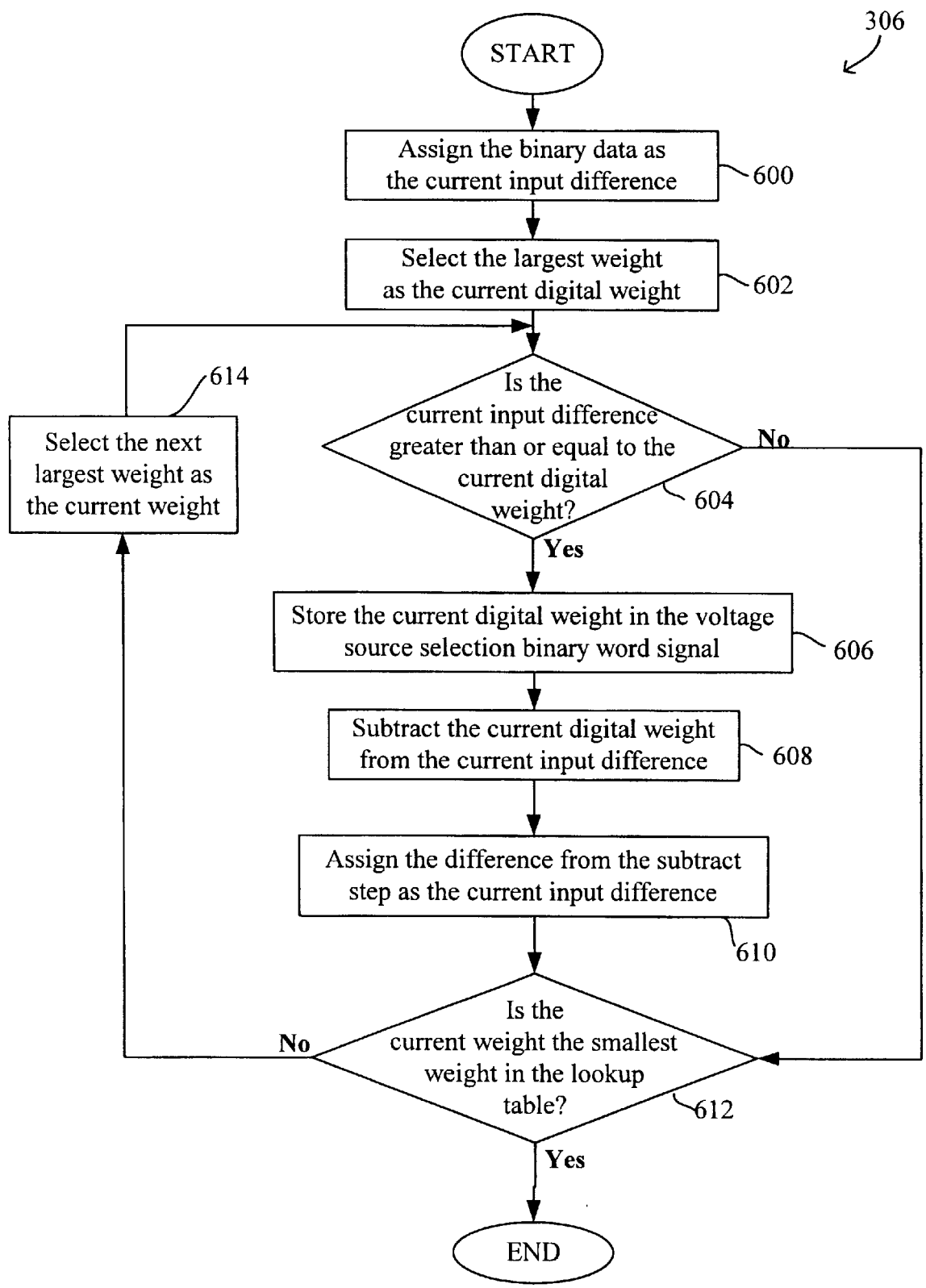
FIG. 6 is a flow chart illustrating determining the analog signal corresponding to a binary input.

FIG. 6 is a flow chart illustrating step 306 of determining the voltage source selection signal from the binary input using the digital weights or sizes stored as memory in the weight table. The determining step 306 first assigns the binary data as the current input difference in step 600 and selects the largest digital weight as the current weight in step 602. The current input difference and the current digital weight are compared with a digital comparator in step 604.

If the current input difference is greater than the current weight, the current weight is stored as a high bit in the voltage source selection binary word signal in step 606 and subtracted by means of a subtractor and a digital control logic, from the current input difference in step 608. The current input difference is assigned as the current input difference in step 610. The determining step 306 then determines whether the current weight is the smallest weight in the weight table in step 612.

Alternatively, if the compare step 604 determines that the current input difference is less than the current weight, step 306 proceeds directly to step 612 to determine whether the current weight is the smallest weight in the weight table.

If the current weight is not the smallest weight in the weight table, step 306 selects the next largest weight as the current weight in step 614 and continues from the compare step 604. Once step 612 determines that the current weight is the smallest weight in the weight table, the determining step 306 is complete. The weight determination process 300 continues to step 308 to output the voltage source selection signal to the analog voltage sources as discussed above.

An example of the processes performed by the DAC 100 will be described with reference to FIG. 7. FIG. 7 shows an example of a weight table 700 with twenty weights 702(a)–702(t). FIG. 7 also shows a table 704 listing the nominal or ideal sizes of the weights. In the weight table 700, the four smallest weights 702(a), 702(b), 702(c), 702(d) may have predetermined or pre-assigned sizes of 1, 2, 4, and 8, respectively. These sizes are assumed to be approximately equal to the nominal or ideal sizes of the weights and are stored in the weight table. As noted above, although the errors of the assumed sizes of these weights may be relatively large, such errors generally are not significant as these weights are small. The remainder of the weights 702(c)–702(t) have sizes that are calibrated using the weights 702(a)–702(d) having predetermined sizes. The sizes of the weights listed in the weight table 700 are examples of the results of the initialization and calibration step 302.

Each weight 702 in the weight table 700 is such that the weight having an undetermined size can be calibrated using weights having previously determined or assigned sizes. Thus, the calibration process determines the approximate sizes of the weights in the weight table 700 using successive approximations. Each weight having an undetermined size is redundant in that it is no greater than a sum of all smaller-sized weights even under worst case manufacturing tolerances. Redundancy ensures that there are no large gaps in possible DAC outputs. In other words, for n weights having redundancy, the dynamic range is less than $2^n$.

The sizes of at least a portion of the weights 702 are determined in the initialize and calibrate step 302 as described above with reference to FIGS. 3–5. The smaller weights are used to measure the larger weights. The calibration of the weights in the weight table 700 is in essence an analog-to-digital conversion. The weight table 700 shown in FIG. 5 is suitable for use in a 16-bit DAC. As is evident, the weight table 700 contains more weights 702 than the number of bits in the binary input. The greater number is due to the redundancy characteristic of the weight table 700 to ensure that there are no large gaps in possible DAC outputs.

The process for determining the size of weight 702(e) using the weights 702(a)–702(d) having predetermined sizes is as follows. The first weight 702(e) to be calibrated is selected. As shown in the nominal size table 704, weight 702(e) has a nominal size of 13. Although the actual weights are fabricated to be close to the nominal sizes on the chip, the nominal sizes are not utilized in the calibration process but are given merely to illustrate that the calibration process may determine that the sizes of the weights may not be the same as the nominal sizes of the weights.

The size of weight 702(e) is determined by disenabling all the weights, setting and enabling the largest determined weight 702(d), and summing all the enabled weights which consists of weight 702(d) having a size of 8. Once the DAC determines that the sum is not greater than the selected weight 702(e), the DAC stores the selected and enabled weight 702(d).

The DAC determines that the selected determined weight 702(d) is not the smallest determined weight in the weight table and selects and enables the next largest weight 702(c), having a nominal size of 4. Again, the DAC sums all the enabled weights 702(d) and 702(c) having sizes of 8 and 4, respectively, and determines that the sum of 12 is not greater than the selected weight 702(e). The DAC then stores the selected and enabled weight 702(c).

The DAC again determines that the selected determined weight 702(c) is not the smallest determined weight in the weight table and selects and enables the next largest weight 702(b), having a nominal size of 2. The DAC sums all the enabled weights 702(d), 702(c), and 702(b), having sizes of 8, 4, and 2, respectively, and determines that the sum of 14 is not greater than the selected weight 702(e). For example, the DAC may simply add the new enabled weight 702(b) having a size of 2 to the previously determined sum, i.e., 12, of the previously enabled weights, i.e., weights 702(d) and 702(c). The DAC then stores the selected and enabled weight 702(b).

The DAC again determines that the selected determined weight 702(b) is not the smallest determined weight in the weight table and selects and enables the next largest weight 702(a), having a nominal size of 1. The DAC sums all the enabled weights 702(d), 702(c), 702(b), and 702(a) having sizes of 8, 4, 2, and 1, respectively, and determines that the sum of 15 is greater than the selected weight 702(e). The DAC then determines that the selected determined weight 702(a) is the smallest determined weight in the weight table and the process of determining or calibrating the size of the selected weight 702(e) is complete. The size of the selected weight 702(e) is thus determined to be the sum of the enabled weights 702(d), 702(c), and 702(b), which is equal to 14.

The digital-to-analog conversion process 300 continues with the determination of the sizes of each remaining weight 702(f)–702(t) using the weights 702(a)–702(d) having predetermined sizes as well as the weights having sizes that are previously determined by the digital-to-analog conversion process 300, such as weight 702(e). Each of these processes is similar to that described above.

The initialize and calibrate step 302 preferably comprises performing numerous sets of successive approximations and an average of the results is generated as the calibrated sizes of the weights. The averaging reduces undesirable and/or uncontrollable effects, such as noise, on the calibration of the weights. The repetition is preferably done by repetitively determining one weight and then repetitively determining the next weight. Such a method is less sensitive to noise. However, other methods, such as determining all the weights of the weight table and repeating the entire process numerous times, may also be utilized.

After the initialize and calibrate step 302 is complete, the DAC 100 is ready to receive binary input and perform digital-to-analog conversion as shown in FIGS. 3 and 6. An example of digital-to-analog conversion 300 performed by the DAC 100 is described using a 17-bit binary input 10000011111101100, equivalent to a decimal value of 67,564.

After receiving the binary input, the DAC 100 determines the voltage source selection signal which selectively enables the analog voltage sources. Specifically, as shown in FIG. 6, the input data of size 67,564 is assigned as the current input difference and the largest weight 702(t) of size 125,412 is selected as the current weight. After determining that the current input difference is not greater than or equal to the current weight, the DAC determines that the current weight 702(t) is not the smallest weight in the weight table and selects the next largest weight 702(s) of size 65,720 as the current weight.

After determining that the current input difference of 67,564 is greater than or equal to the current weight of 65,720, the current weight 702(s) is stored and subtracted from the current input difference of 67,564. The difference of 1,844 is assigned as the current input difference. The DAC again determines that the current weight 702(s) is not the smallest weight in the weight table.

The DAC continues with the selection of each of the weights 702 until the selected weight is determined to be the smallest weight 702(a). Once the smallest weight 702(a) is reached, the step of determining the voltage source selection signal is complete. In particular, the voltage source selection signal selectively enables weights 702(s), 702(m), 702(j), 702(d), 702(c), 702(b) of sizes 657,20, 1487, 343, 8, 4, and 2, respectively, for the binary input 10000011111101100. The sum of these stored weights is 67,564, the digital value of the binary input. The sum is output by the DAC as an analog signal.

The DAC described above can have any level of desired redundancy. Although the initialization and calibration process may be slow relative to the rate of the digital-to-analog conversion, the initialization and calibration process is generally only performed once for a given DAC or can be performed during a system reset time.

Although the weight table 700 of the DAC 10 has been described in terms of storing the relative calibrated sizes of the weights 702, the weight table may alternatively store the difference between the calibrated weight value and the nominal weight value. The nominal or ideal sizes of the weights are preferably selected such that the weights in the weight table are redundant to avoid gaps. Alternatively or additionally, redundancy may be implemented by providing an excess of one or more of the lower valued weights. For example, redundancy may be implemented by providing multiples of weight 702(d) having a size of 8.

Although the present invention has been described in accordance with the embodiments shown, one of ordinary skill in the art will readily recognize that variations to the embodiments are within the spirit and scope of the present invention. Accordingly, many modifications may be made by one of ordinary skill in the art without departing from the spirit and scope of the appended claims.

What is claimed is:

1. A digital-to-analog converter, comprising:
a plurality of analog weights;
a weight table adapted to store digital sizes of the plurality of analog weights; and
a converter for searching for selected weights from the plurality of analog weights using the digital sizes stored in the weight table and for mapping a binary input to the selected analog weights.

2. The digital-to-analog converter according to claim 1, wherein the selected weights comprise zero or more of the plurality of analog weights in the weight table.

3. The digital-to-analog converter according to claim 1, wherein the converter comprises a subtractor and a digital control logic for successively subtracting each of the selected weights from the binary input.

4. The digital-to-analog converter according to claim 3, wherein the plurality of analog weights and the sizes in the weight table are arranged according to size and the converter further comprises a digital comparator for sequentially comparing each of the sizes with a value selected from the group consisting of the binary input and differences generated by the subtractor and digital control logic.

5. The digital-to-analog converter according to claim 4, wherein the selected weights are weights having sizes no greater than the compared value as determined by the comparator.

6. The digital-to-analog converter according to claim 1, wherein the sizes of the analog weights are determined by successive approximations.

7. The digital-to-analog converter according to claim 1, wherein the sizes of the analog weights are measured quantities.

8. The digital-to-analog converter according to claim 1, wherein the plurality of analog weights contains at least one redundant analog weight, each redundant analog weight being no greater than a sum of all analog weights smaller than the redundant analog weight.

9. The digital-to-analog converter according to claim 8, wherein all analog weights except at least two smallest analog weights in the weight table are redundant analog weights.

10. The digital-to-analog converter according to claim 1, wherein said analog weights are selected from the group consisting of voltage sources, current sources, and charge sources.

11. A method for digital-to-analog conversion, comprising:
receiving a binary input;
searching for selected weights from a plurality of analog weights using a weight table storing digital sizes of the plurality of analog weights;
mapping the binary input to the selected analog weights; and
outputting a sum of the selected analog weights.

12. The method for digital-to-analog conversion according to claim 11, wherein the searching includes successively subtracting the size of each of the selected analog weights from the binary input to generate successive differences.

13. The method for digital-to-analog conversion according to claim 12, wherein the searching further includes sequentially comparing the size of each of the analog weights with a value selected from the binary input and the successive differences.

14. The method for digital-to-analog conversion according to claim 13, wherein the searching further includes selecting zero or more analog weights being compared that are no greater than the compared value.

15. The method for digital-to-analog conversion according to claim 11, wherein the analog weights are determined by successive approximations.

16. The method for digital-to-analog conversion according to claim 15, wherein said successive approximations include analog comparisons.

17. The method for digital-to-analog conversion according to claim 11, wherein the analog weights are measured quantities.

18. The method for digital-to-analog conversion according to claim 11, wherein the weight table contains at least one redundant analog weight, each redundant analog weight being no greater than a sum of all analog weights smaller than the redundant analog weight.

19. The method for digital-to-analog conversion according to claim 18, wherein all analog weights except at least two smallest analog weights in the weight table are redundant analog weights.

20. A method for converting a digital signal to an analog signal, comprising:

successively comparing the digital signal to weights stored in an order according to size of each weight in a weight table, each comparing being between the digital signal and one of the weights, starting with a highest analog weight;

selecting the weight being compared that is no greater than the digital signal;

subtracting the selected weight from the digital signal to generate a digital signal difference;

repeating successively comparing, selecting, and subtracting with the digital signal difference instead of the digital signal and with the analog weights not previously compared until after the lowest analog weight is compared; and setting the analog signal as a sum of the selected weights.

21. The method for converting a digital signal to an analog signal according to claim 20, wherein the analog weights are determined by successive approximations.

22. The method for converting a digital signal to an analog signal according to claim 20, wherein the analog weights are measured quantities.

23. The method for converting a digital signal to an analog signal according to claim 20, wherein the weights in the weight table include at least one redundant analog weight, each redundant analog weight being no greater than a sum of all analog weights smaller than the redundant analog weight.

24. The method for converting a digital signal to an analog signal according to claim 23, wherein all analog weights in the weight table except at least two smallest analog weights in the weight table are redundant analog weights.

25. A method for converting a digital signal to an analog signal, comprising:

(a) setting the digital signal as a current input difference;

(b) selecting a current weight from a weight table, the weight table storing a plurality of analog weights arranged in an order according to size of each analog weight, each selecting being in a successive manner from a highest analog weight to a lowest analog weight;

(c) comparing the current input difference to the current weight;

(d) repeating (b) and (c) until the current weight is no greater than the current input difference;

(e) storing the current weight;

(f) subtracting the current weight from the current input difference;

(g) setting the current input difference as the difference from (f);

(h) continuing from (b) until the lowest analog weight is compared; and (i) setting the analog signal as a sum of the stored weights.

26. A method for determining a size of an undetermined weight in a weight table having the undetermined weight and a plurality of determined weights, the determined weights including at least two smallest weights of the weight table, the weights in the weight table being arranged in an order according to size of each weight, comprising:

searching for selected weights from the determined weights in the weight table;

mapping undetermined weight to the selected weights; and outputting a sum of the selected weights as the size of the undetermined weight.

27. The method for determining a size of an undetermined weight according to claim 26, wherein the searching includes successively subtracting each of the selected weights from the undetermined weight to generate successive differences.

28. The method for determining a size of an undetermined weight according to claim 27, wherein the searching further includes sequentially comparing each of the determined weights with a value selected from the undetermined weight and the successive differences.

29. The method for determining a size of an undetermined weight according to claim 28, wherein the searching further includes selecting zero or more of the determined weights being compared that are no greater than the compared value selected from the undetermined weight and the successive differences.

30. The method for determining a size of an undetermined weight according to claim 26, wherein the undetermined weight is a redundant weight that is no greater than a sum of all analog determined weights.

31. A method for determining a size of an undetermined weight in a weight table having the undetermined weight and at least two smallest weights having determined sizes, the weights being arranged in the weight table in an order according to size of each weight, comprising:

(a) setting the undetermined weight as a current difference;

(b) selecting a current determined weight from the weight table, each selecting being in a successive manner from a largest determined weight to a smallest determined weight;

(c) comparing the current difference to the current determined weight;

(d) repeating (b) and (c) until the current determined weight is no greater than the current difference;

(e) storing the current determined weight;

(f) subtracting the current determined weight from the current difference to generate a difference;

(g) setting the current difference as the difference from (g);

(h) continue from (b) until the smallest analog weight is compared; and (i) summing the selected weights and assigning the sum as a determined weight of the selected undetermined weight.

* * * * *